US006786390B2

(12) United States Patent
Yang et al.

(10) Patent No.: US 6,786,390 B2
(45) Date of Patent: Sep. 7, 2004

(54) LED STACK MANUFACTURING METHOD AND ITS STRUCTURE THEREOF

(75) Inventors: Kuang-Neng Yang, Pingjen (TW); Pai-Hsiang Wang, Jungli (TW); Chih-Sung Chang, Hsinchu (TW); Tzer-Perng Chen, Hsinchu (TW)

(73) Assignee: United Epitaxy Company Ltd., Hsinchu (TW)

( * ) Notice: Subject to any disclaimer, the term of this patent is extended or adjusted under 35 U.S.C. 154(b) by 37 days.

(21) Appl. No.: 10/357,445

(22) Filed: Feb. 4, 2003

(65) Prior Publication Data
US 2004/0149810 A1 Aug. 5, 2004

(51) Int. Cl.[7] .............................................. B23K 31/02
(52) U.S. Cl. ..................... 228/179.1; 228/191; 228/225; 228/227; 228/254
(58) Field of Search ........................... 228/179.1, 254, 228/225, 226, 227, 191, 264

(56) References Cited

U.S. PATENT DOCUMENTS

| | | | | |
|---|---|---|---|---|
| 4,963,508 A | * | 10/1990 | Umeno et al. ................. 117/90 |
| 5,376,580 A | * | 12/1994 | Kish et al. ..................... 438/26 |
| 5,391,257 A | * | 2/1995 | Sullivan et al. ............. 438/458 |
| 5,406,575 A | * | 4/1995 | Chelny et al. ................ 372/45 |
| 5,502,316 A | * | 3/1996 | Kish et al. .................... 257/94 |
| 6,169,296 B1 | * | 1/2001 | Kamiyama et al. ........... 257/94 |
| 6,258,699 B1 | * | 7/2001 | Chang et al. ................ 438/458 |
| 6,465,809 B1 | * | 10/2002 | Furukawa et al. ............ 257/94 |
| 6,468,824 B2 | * | 10/2002 | Chen et al. ................... 438/46 |
| 6,542,528 B1 | * | 4/2003 | Sato et al. .................... 372/45 |
| 6,716,654 B2 | * | 4/2004 | Hsu et al. ..................... 438/22 |
| 2001/0019134 A1 | * | 9/2001 | Chang et al. ................ 257/79 |
| 2002/0185648 A1 | * | 12/2002 | Furukawa et al. ........... 257/79 |
| 2003/0087463 A1 | * | 5/2003 | Horng et al. ................ 438/29 |
| 2003/0143772 A1 | * | 7/2003 | Chen ........................... 438/47 |
| 2003/0164503 A1 | * | 9/2003 | Chen ........................... 257/79 |
| 2003/0173602 A1 | * | 9/2003 | Hsu et al. ................... 257/290 |
| 2003/0178637 A1 | * | 9/2003 | Chen et al. ................ 257/189 |

* cited by examiner

Primary Examiner—Kiley Stoner
(74) Attorney, Agent, or Firm—Birch, Stewart, Kolasch & Birch, LLP

(57) ABSTRACT

A LED stacking manufacturing method and its structure thereof, mainly uses a stacking method to integrate the epitaxial layer and the high-thermal-conductive substrate by twice bonding process, and the converted epitaxial layer of the temporary bonded substrate replaces the epitaxial wafer growth substrate, and the second bonded layer of the etch stop layer of the epitaxial layer is bonded with the second bonded layer of the high-thermal-conductive substrate to form an alloy layer with permanent connection, and then the temporary bonded substrate is removed, such that the process completes the integration of the epitaxial layer and the high-thermal-conductive substrate and makes the ohmic contact layer to face upward to provide a better reliability and efficiency of optical output of the LED.

19 Claims, 5 Drawing Sheets

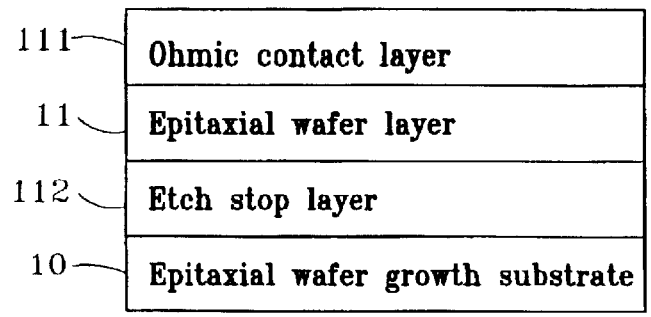
F I G. 2
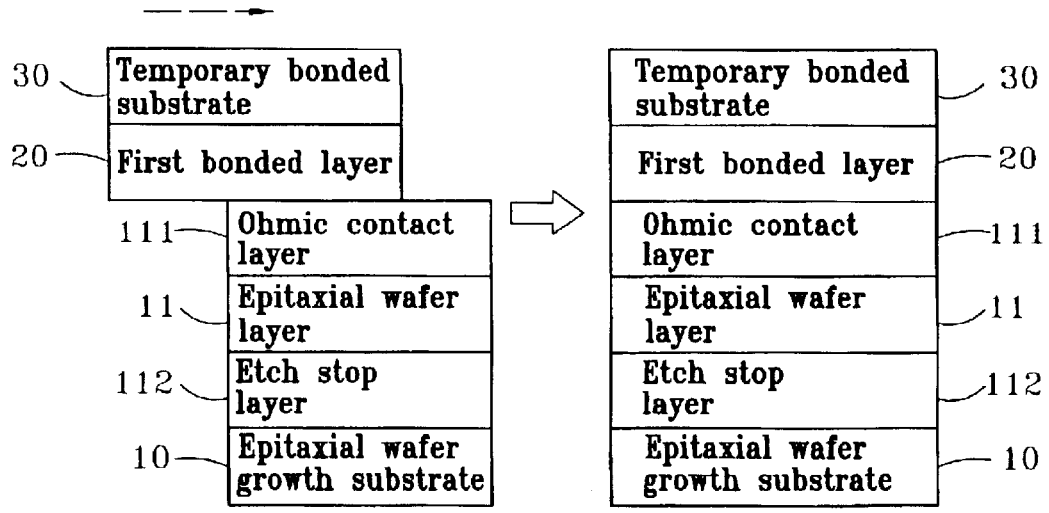
F I G. 3

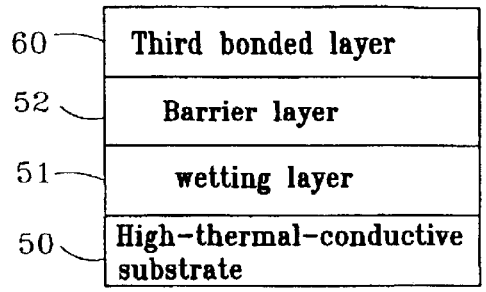
F I G. 6
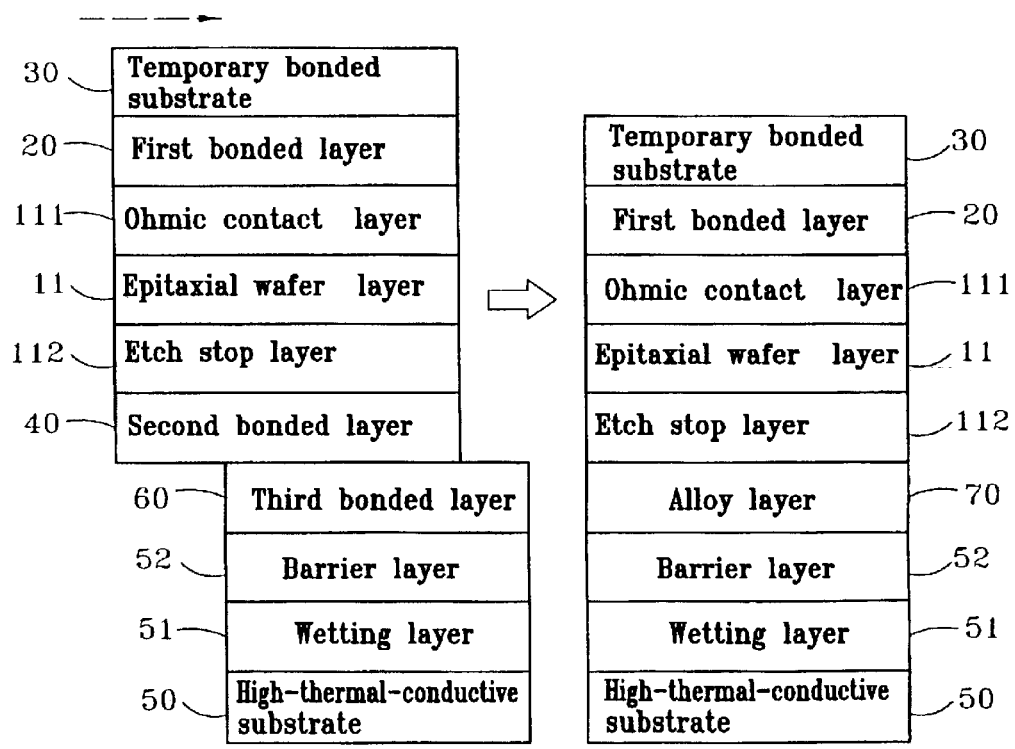
F I G. 7

LED STACK MANUFACTURING METHOD AND ITS STRUCTURE THEREOF

FIELD OF THE INVENTION

The present invention relates to a LED stack manufacturing method and its structure thereof, more particularly to the vertical stacking method and twice bonding process to convert the epitaxial layer and high-thermal-conductive substrate into a LED with more reliable and efficient optical output.

BACKGROUND OF THE INVENTION

Traditional light emitting diode (LED) uses the chemical compound semiconductor substrate (III-V compound such as gallium arsenide (GaAs), indium phosphate (InP), gallium phosphate (GaP), and aluminum oxide ($Al_2O_3$) as well as the epitaxial wafer growth technology to develop the N-type and P-type semiconductor. The epitaxial wafer goes through the chemical, lithographical, etching, evaporation, and polishing processes to form the compound semiconductor component, which is cut in to dices, and finally attaches the dice on the conductive frame for packaging into products such as lamp bulbs.

Since the compound semiconductor substrate material of the aforementioned product will absorb the photons emitted downwardly from the LED to the substrate, therefore the optical output efficiency will be reduced drastically. Furthermore, the substrate for growth the epitaxial wafer generally has lower thermal conductivity (<80 W/m-K), and thus the packaged component cannot be operated under a higher current and also cannot accomplish higher output efficiency. In the meantime, the thermal conductivity of the substrate is lower, which will seriously deteriorate the actual life of the component by the influence of external factors such as weather.

At present, some LED has improvement on the aforementioned shortcomings, but such technology still has its shortcomings and limitations, which is described as follows:

1. In the journal "Applied Physics Letter Vol. 64, No. 21, 2839, (1994)" entitled "Very high-efficiency semiconductor wafer-bonded transparent-substrate ($Al_xGa_{1-x})_{0.5}$P/GaP" by Kish, et. al, a LED with transparent substrate (TS) wafer($Al_xGa_{1-x})_{0.5}In_{0.5}$P/GaP of a wafer bonding is disclosed. Such ($Al_xGa_{1-x})_{0.5}In_{0.5}$P/GaP uses the vapor phase epitaxial growth to form a P-type gallium phosphate (GaP) window with a thickness of about 50 i m, and then uses the conventional chemical etching method to selectively remove the N-type gallium arsenide substrate (GaAs), and then bonds the exposed N-type layer to the N-type gallium phosphate (GaP) substrate of about 8–10 mil thick. As to the luminous intensity, the luminous intensity of the TS AlGaInP LED produced by such method is increased by 1~2 times of the AlGaInP LED produced by the absorbing-substrate (AS). However, the shortcomings of such TSAlGaInP LED include its complicated manufacturing process and the manufacturing requirement of high temperature from 800° C. to 1000° C. Therefore, it is difficult to accomplish the high yield or lower the manufacturing cost.

2. Another technology disclosed in Applied Physics Letter Vol. 75, No. 20, 3054, (1999)" entitled "AlGaInP light-emitting diodes with mirror substrates fabricated by wafer bonding" by Horng, et.al uses a wafer fusion technology to form a mirror-substrate (MS) AlGaInP/metal/silicon dioxide/silicon LED, which uses AuBe/Au as the adhesive material to bond the silicon substrate and the LED epitaxial wafer layer. However, in the bonding process of 20 ma current, the luminous strength of such MS AlGaInP LED is only about 90 mcd, which is still 40% less than the luminous strength of the TS AlGaInP LED and therefore its luminous strength is unable to meet the requirements. Furthermore, the P-type electrode and the N-type electrode are formed on the same side, therefore the size cannot be reduced and its size is even larger than the traditional LED wafer with the P-type electrode and N-type electrode located on different sides. Therefore, it cannot satisfy the requirement for trend of having smaller size in packaging.

SUMMARY OF THE INVENTION

The primary objective of the present invention is to overcome the aforementioned shortcomings and avoid the existence of the shortcoming by using a stacking method to integrate the epitaxial layer and the high-thermal-conductive substrate by twice bonding process, and the converted epitaxial layer of the temporary bonded substrate replaces the epitaxial wafer growth substrate, and the second bonded layer of the etch stop layer of the epitaxial layer is bonded with the second bonded layer of the high-thermal-conductive substrate to form an alloy layer with permanent connection, and then the temporary bonded substrate is removed, such that the process completes the integration of the epitaxial layer and the high-thermal-conductive substrate and makes the ohmic contact layer to face upward. The objectives of the present invention are summarized as follows:

1. Each bonded layer according to the present invention adopts the stacking pressurization at a lower temperature range from 150° C. to 400° C. for the formation. As to the manufacturing process, it is simpler and easier to the control the yield rate and lower the manufacturing cost when compared with the abovementioned technologies, and the bonded layer under the liquid fused state at low temperature can repair the unevenness of the developed epitaxial wafer layer of the compound semiconductor substrate, so that the bonding of the finished goods will be tighter.

2. Since the epitaxial wafer layer is bonded to the high-thermal-conductive substrate by an alloy layer, and the value of the high-thermal-conductive substrate is larger than 120 W.m-K, which can accomplish an excellent effect of heat dispersion so that the performance of the product is more stable, and can be used in larger current.

3. The ohmic contact layer of the epitaxial wafer layer faces upward after it is produced, and it can avoid the reduction or deterioration of the emitting photons to assure the optical output efficiency of the present invention. The ohmic contact layer and etch stop layer of the epitaxial wafer layer are located on different sides of the surface, and it can further satisfy the requirements for a small and compact product after packaging.

To make it easier for our examiner to understand the objective of the invention, its structure, innovative features, and its performance, we use a preferred embodiment together with the attached drawings for the detailed description of the invention.

BRIEF DESCRIPTION OF THE DRAWINGS

Other objects, features, and advantages of the invention will become apparent from the following detailed description of the preferred but non-limiting embodiment. The description is made with reference to the accompanying drawings, in which:

FIG. 2 is an illustrative diagram of the epitaxial wafer growth substrate and the epitaxial wafer layer of the present invention.

FIG. 3 is an illustrative diagram of the bonding of the first bonded layer with the temporary bonded substrate according to the present invention.

FIG. 6 is an illustrative diagram of the formation of the high thermal conductive substrate and the third bonded layer of the present invention.

FIG. 7 is an illustrative diagram of the formation of the alloy layer of the present invention.

DETAILED DESCRIPTION OF THE PREFERRED EMBODIMENTS

Figure 1:
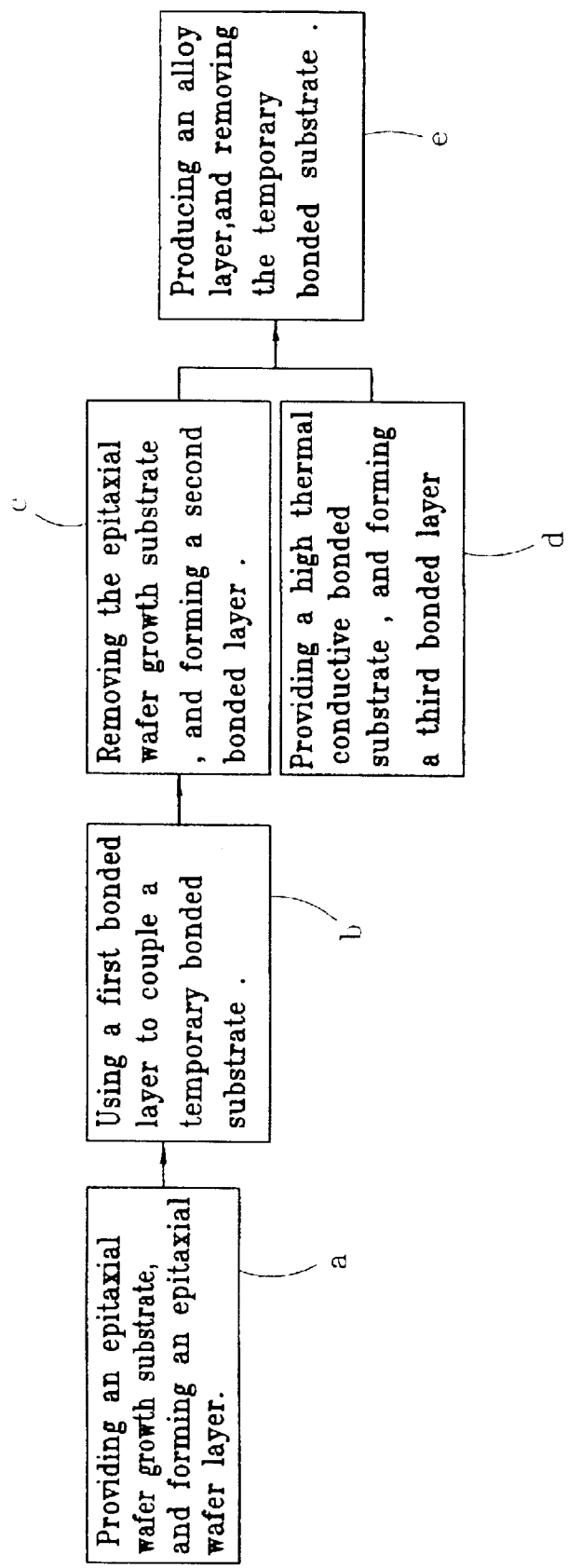
FIG. 1 is an illustrative diagram of the manufacturing procedure of the present invention.

Please refer to FIG. 1 for the illustrative diagram of the manufacturing procedure of the present invention. In the figure, the present invention makes use of the stacking method to process the twice bonding process for an epitaxial wafer layer 11 grown on substrate 10 bonded on the high-thermal-conductive substrate 50 for the manufacture of LED, and the manufacturing process comprises the steps of:

(a) providing an epitaxial wafer growth substrate 10 with an epitaxial wafer layer 11 on it, and defining the upper and lower surface layers of the epitaxial wafer layer 11 as an ohmic contact layer 111 and an etch stop layer 112;

(b) bonding the first bonded layer 20 on the ohmic contact layer 111 of the epitaxial wafer layer 11 with a temporary bonded substrate 30, and removing the epitaxial growth substrate 10 after the bonding of the temporary bonded substrate 30 is completed;

(c) forming a second bonded layer 40 on the etch stop layer 112 after the epitaxial wafer growth substrate 10 is removed;

(d) providing a high-thermal-conductive substrate 50 with a third bonded layer 60 formed on it;

(e) bonding the second bonded layer 40 and the third bonded layer 60 of the steps (c) and (d) to form an alloy layer 70, and removing the temporary bonded substrate 30.

Each step will be described in details together with reference to the accompanying drawings.

Please refer to FIG. 2 for the illustrative diagram of the epitaxial wafer growth substrate 10 and the epitaxial wafer layer 11 of the present invention. In the figure, the epitaxial wafer growth substrate 10 of the present invention is the III~V compound semiconductor substrate, and the material of such compound semiconductor substrate is selected from any one in the group of gallium arsenide (GaAs), indium phosphate (InP), gallium phosphate (GaP), and sapphire; the epitaxial wafer layer 11 has gone through any of the metal organic chemical vapor deposition (MOVCD) method, or liquid phase epitaxial growth (LPE) method, or molecular beam epitaxial growth (MBE) method to meet the requirement of the trend of small and compact product after the packaging. When the epitaxial wafer layer 11 is formed, the upper and lower surface layers of the epitaxial wafer layer 11 on different sides are ohmic contact layer 111 (P-type) and the etch stop layer 112 (N-type) respectively.

Please refer to FIG. 3 for the illustrative diagram of bonding the first bonded layer 20 with the temporary bonded substrate 30 according to the present invention. In the figure, after the epitaxial wafer layer 11 is developed and the ohmic contact layer 111 and etch stop layer 112 are defined, the first bonded layer 20 on the ohmic contact layer 111 is formed, and the temporary bonded substrate 30 and the first bonded layer 20 are pressed face to face and put into an environment at a specific temperature to carry out the temporary bonding process. Such temperature will vary according to the melting point of the material of the first bonded layer 20; wherein the first bonded layer 20 is preferred to be a metal layer with melting point between 150° C. to 350° C. or adhesive agent, and the first bonded layer 20 is made of indium, gold-tin alloy, or alloy with melting points within this range. Since the matter with low melting point (melting point 150~350° C.) adopted in the bonding step will turn into liquid state when it is bonded, therefore a bonding effect better than the traditional direct bonding by solid state pressing can be accomplished. In the meantime, even the surface of the epitaxial wafer is not even, the first bonded layer 20 can be used to tightly bond them together.

Figure 4:
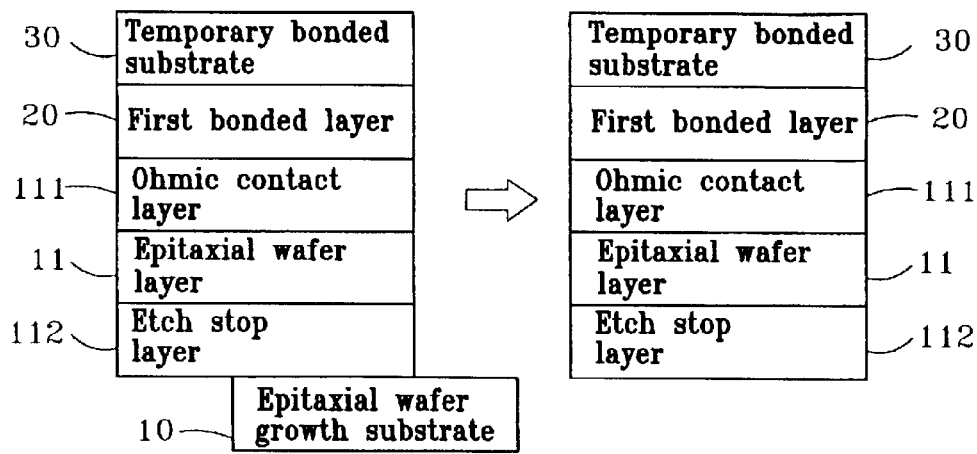
FIG. 4 is an illustrative diagram of removing the epitaxial wafer growth substrate according to the present invention.
Figure 5:
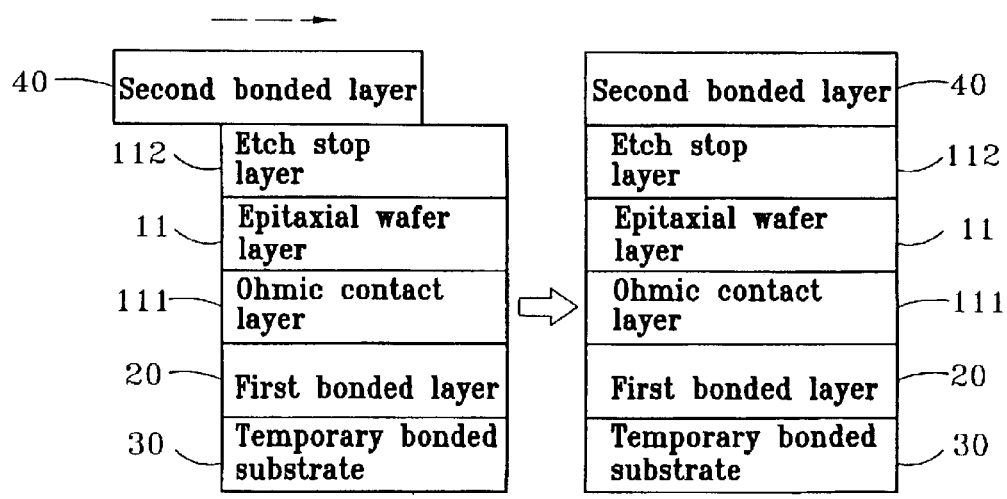
FIG. 5 is an illustrative diagram of second bonded layer of the present invention.

In FIG. 4, after the temporary bonded substrate 30 is converted into the epitaxial wafer layer 11 by the first bonded layer 20, the epitaxial wafer growth substrate 10 is removed by etching, and a second bonded layer 40 is formed on the etch stop layer 112 after the etching as shown in FIG. 5.

Please refer to FIG. 6 for the illustrative diagram of the high-thermal-conductive substrate 50 and the third bonded layer 60 of the present invention. In the figure, a high thermal conductive substrate 50 with thermal conductivity larger than 120 W/m-K, and the material of such high-thermal-conductive substrate 50 is selected from any from the group of silicon (Si), aluminum (Al), copper (Cu), silver (Ag), silicon carbide (SiC), diamond, graphite, molybdenum, and aluminum nitride. Before the third bonded layer 60 is formed on the high-thermal-conductive substrate 50, and since the later manufacturing process requires to form an alloy layer 70 with permanent bonding by the second and third bonded layers 40, 60, the internal diffusion contamination of high-thermal-conductive substrate 50 or bad reaction of the material of the third bonded layer 60 is generated, therefore a barrier layer 52 with high melting point is formed on the high-thermal-conductive substrate 50. However, since the material of the barrier layer 52 is selected from any of the group of molybdenum, platinum, tungsten, indium oxide, tin oxide, indium tin oxide, zinc oxide, and magnesium oxide, and the active reaction will not bond with the high-thermal-conductive substrate 50, therefore a wetting layer 51 for increasing active bonding is formed between the barrier layer 52 and the high-thermal-conductive substrate 50. The material of the wetting layer 51 is selected from a group of chromium, titanium, and nickel.

Please refer to FIG. 7 for the illustrative diagram of the formation of the alloy layer 70 of the present invention. In the figure, since the second bonded layer 40 and the third bonded layer 60 are formed by deposition, evaporation, or sputter. At that time, the bonded layer 40 and the third bonded layer 60 are pressed face to face, and put into an environment at a specific temperature to carry out the bonding process and form an alloy layer 70 with permanent connection. Such temperature will vary according to the melting point of the chosen metal bonded layer; wherein the second and third bonded layers 40, 60 are metal layers with melting point between 150° C. to 400° C. Take the indium and gold as examples, the second bonded layer 40 (indium) and the third bonded layer 60 (gold), face to each other and are pressed, and put into an environment at a specific temperature and the preferred temperature for the bonding process is about 200° C. Since the melting point of indium is about 150° C., the indium will melt at 200° C., and form a strong gold-indium alloy ($AuIn_2$) and the melting point of such alloy is about 450° C.

Figure 8:
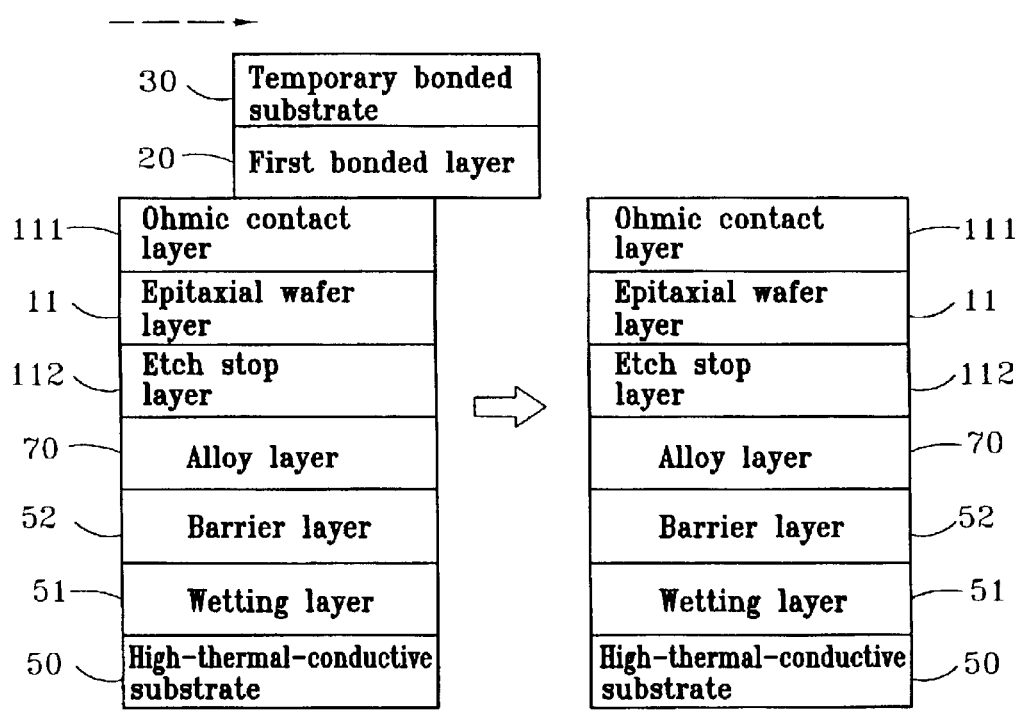
FIG. 8 is an illustrative diagram of removing the temporary bonded substrate according to the present invention.

When the formation of the alloy layer 70 is finished, it means the high-thermal-conductive substrate 50 forms a permanent substrate of an epitaxial wafer layer 11. In FIG. 8, the temporary bonded substrate 30 is removed such that the ohmic contact layer 111 of the epitaxial layer 11 faces upward. The production of LED is completed. Since the epitaxial layer 11 is connected to the high-thermal-conductive substrate 50 by the alloy layer 70, and such high-thermal-conductive substrate 50 adopted in the present invention is larger than 120 W/m-K, the effect of good heat dissipation can be accomplished, and the product according to the present invention will be more stable and can be used for larger current. Further, the ohmic contact layer 111 of the epitaxial layer 11 faces upward after its production, it prevents the emitting photons from reducing or deteriorating and ensures the optical output efficiency of the present invention (compared with the existing product with the ohmic contact layer 111 facing downward, the LED with the ohmic contact layer 111 facing upward according to the present invention enhances the optical output efficiency by 100%).

In summation of the above description, the present invention herein enhances the performance than the conventional method and further complies with the patent application requirements and is submitted to the Patent and Trademark Office for review and granting of the commensurate patent rights.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A LED stack manufacturing method, producing LED by a twice bonding process for an epitaxial wafer layer grown on substrate bonded on a high-thermal-conductive substrate, comprising the steps of:

(a) providing an epitaxial wafer growth substrate with an epitaxial wafer layer on top of the epitaxial wafer growth substrate, and defining an upper layer and a lower surface layer of the epitaxial wafer layer as an ohmic contact layer and an etch stop layer;

(b) bonding the a first bonded layer on the ohmic contact layer of the epitaxial wafer layer with a temporary bonded substrate, and removing the epitaxial growth substrate after the bonding of the temporary bonded substrate is completed;

(c) forming a second bonded layer on the etch stop layer after the epitaxial wafer growth substrate is removed;

(d) providing a high thermal conductive substrate with a third bonded layer formed on top of the high-thermal-conductive substrate;

(e) bonding the second bonded layer and the third bonded layer as described in steps (c) and (d) to form an alloy layer, and removing the temporary bonded substrate;

such arrangement couples the epitaxial wafer layer and the high-thermal-conductive substrate and makes the ohmic contact layer facing upward to improve the stability and optical output efficiency of the LED.

2. The LED stack manufacturing method as claimed in claim 1, wherein said epitaxial wafer growth substrate being a III–V compound semiconductor substrate.

3. The LED stack manufacturing method as claimed in claim 2, wherein said compound semiconductor substrate being one selected from the group consisting of gallium arsenide (GaAs), indium phosphate (InP), gallium phosphate (GaP) and sapphire.

4. The LED stack manufacturing method as claimed in claim 1, wherein said epitaxial wafer layer being produced by a method selected from the group consisting of metal organic chemical vapor deposition (MOVCD), liquid phase epitaxial growth (LPE), and molecular beam epitaxial growth.

5. The LED stack manufacturing method as claimed in claim 1, wherein said first bonded layer being a metal layer with a melting point between 150° C. and 350° C.

6. The LED stack manufacturing method as claimed in claim 5, wherein said first bonded layer being one selected from the group consisting of indium, gold-tin (AuSn) alloy, and alloy with a melting point between 150° C. and 400° C.

7. The LED stack manufacturing method as claimed in claim 1, wherein said first bonded layer being an adhesive agent with a melting point between 150° C. and 350° C.

8. The LED stack manufacturing method as claimed in claim 1, wherein said second bonded layer being a metal layer with a melting point between 150° C. and 400° C.

9. The LED stack manufacturing method as claimed in claim 8, wherein said second bonded layer being one selected from the group consisting of indium and gold.

10. The LED stack manufacturing method as claimed in claim 1, wherein said third bonded layer being a metal layer with a melting point between 150° C. and 400° C.

11. The LED stack manufacturing method as claimed in claim 10, wherein said third bonded layer being one selected from the group consisting of gold and indium.

12. The LED stack manufacturing method as claimed in claim 1, wherein said first bonded layer being formed by adding pressure at the temperature from 150° C. and 350° C.

13. The LED stack manufacturing method as claimed in claim 1, wherein said second bonded layer and third bonded layer forming an alloy layer by adding pressure at the temperature from 150° C. and 350° C.

14. The LED stack manufacturing method as claimed in claim 1, wherein said third bonded layer and said high-thermal-conductive substrate having a barrier layer in between to prevent the third bonded layer from generating an internal diffusion.

15. The LED stack manufacturing method as claimed in claim 14, wherein said barrier layer and high-thermal-conductive substrate having a wetting layer in between to improve the activated coupling.

16. The LED stack manufacturing method as claimed in claim 14, wherein said barrier layer being made of a material selected from the group consisting of molybdenum, platinum, tungsten, indium oxide, tin oxide, indium tin oxide, zinc oxide, and magnesium oxide.

17. The LED stack manufacturing method as claimed in claim 15, wherein said wetting layer being made of a material selected from the group consisting of chromium, titanium, and nickel.

18. The LED stack manufacturing method as claimed in claim 1, wherein said high-thermal-conductive substrate having a thermal conductivity larger than 120 W/m-K.

19. The LED stack manufacturing method as claimed in claim 1, wherein said high-thermal-conductive substrate being made of a material selected from a group consisting of silicon (Si), aluminum (Al), copper (Cu), silver (Ag), silicon carbide (SiC), diamond, graphite, molybdenum, and aluminum nitride.

* * * * *